(12) United States Patent
Kato et al.

(10) Patent No.: US 8,564,321 B2
(45) Date of Patent: Oct. 22, 2013

(54) CERAMIC SUBSTRATE, FUNCTIONAL CERAMIC SUBSTRATE, PROBE CARD AND METHOD FOR MANUFACTURING CERAMIC SUBSTRATE

(75) Inventors: Tatsuya Kato, Nagoya (JP); Hiroyuki Takahashi, Kasugai (JP); Shigeru Taga, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 400 days.

(21) Appl. No.: 12/991,805

(22) PCT Filed: May 11, 2009

(86) PCT No.: PCT/JP2009/058775
§ 371 (c)(1),
(2), (4) Date: Oct. 9, 2010

(87) PCT Pub. No.: WO2009/139354
PCT Pub. Date: Nov. 19, 2009

(65) Prior Publication Data
US 2011/0057678 A1 Mar. 10, 2011

(30) Foreign Application Priority Data
May 16, 2008 (JP) .................................. 2008-130085

(51) Int. Cl.
*G01R 31/00* (2006.01)

(52) U.S. Cl.
USPC ................................ 324/756.03; 324/756.07

(58) Field of Classification Search
None
See application file for complete search history.

(56) References Cited

U.S. PATENT DOCUMENTS

| 6,143,421 A | * | 11/2000 | Ritland et al. | ................. 428/545 |
| 7,292,055 B2 | * | 11/2007 | Egitto et al. | ............. 324/754.18 |
| 2003/0077924 A1 | * | 4/2003 | Shirasaki | ........................ 439/68 |
| 2005/0078433 A1 | | 4/2005 | Ichiyanagi et al. | |

FOREIGN PATENT DOCUMENTS

| JP | 5-075264 | 3/1993 |
| JP | 5-235551 | 9/1993 |
| JP | 6-006015 | 1/1994 |
| JP | 8-115999 | 5/1996 |
| JP | 8-236938 | 9/1996 |
| JP | 2005-126322 | 5/2005 |
| JP | 2005-249527 | 9/2005 |
| JP | 2007-123468 | 5/2007 |

OTHER PUBLICATIONS

International Search Report for PCT/JP2009/058775, (Apr. 2007).

\* cited by examiner

*Primary Examiner* — Minh N Tang
(74) *Attorney, Agent, or Firm* — Stites & Harbison PLLC; Jeffrey A. Haeberlin; Nicolo Davidson (57) ABSTRACT

A ceramic substrate has a base material composed of an amorphous phase and particles composed of a crystalline phase and dispersed in the base material. Some of the particles are permitted to protrude from at least one surface of the base material. The amorphous phase can contain glass and the crystalline phase can contain a crystalline filler.

11 Claims, 4 Drawing Sheets

CERAMIC SUBSTRATE, FUNCTIONAL CERAMIC SUBSTRATE, PROBE CARD AND METHOD FOR MANUFACTURING CERAMIC SUBSTRATE

TECHNICAL FIELD

The present invention relates to a ceramic substrate, a functional ceramic substrate unit and a manufacturing method of a ceramic substrate, and more specifically, relates to a ceramic substrate suitable for use in a wafer test substrate unit, a functional ceramic substrate unit, a manufacturing method of a ceramic substrate and a probe card as a wafer test substrate unit.

BACKGROUND ART

There has recently been an increasing demand to conduct IC test in Si wafer unit. With the upsizing of Si wafers, it is currently demanded to conduct such test even on ϕ300 mm (12-inch) Si wafers. For the test of these wafers, a measurement jig needs to be formed with a connection terminal for contact with a pad of the wafer.

As the measurement jig is used repeatedly upon contact with wafers to be tested, it is required that a substrate of the measurement jig has high strength to withstand repeated measurements. From this point of view, a ceramic substrate is used as the substrate of the measurement jig. The ceramic substrate is generally manufactured by producing a sintered ceramic body through a predetermined sintering process and performing a polishing treatment to smoothen front and back surfaces of the sintered ceramic body and thereby adjust the sintered ceramic body to a given thickness.

By the above polishing treatment, however, microcracks occur in front and back surfaces of the ceramic substrate so that the front and back surfaces of the ceramic substrate have brittle layers containing these microcracks at surface portions thereof. This causes deterioration in the strength of the ceramic substrate and results in failure to exert the intrinsic high-strength characteristics of the ceramic substrate adequately.

In view of such a problem, for example, Patent Document 1 describes an attempt to modify and repair the brittle layers of the ceramic substrate by, after the polishing treatment, heat treating the ceramic substrate in a temperature range lower than a sintering temperature of the ceramic substrate. However, there is a case where the ceramic substrate shrinks again by the heat treatment and shows a large derivation from the target dimensions. Namely, the dimension accuracy of the ceramic substrate can be deteriorated by the heat treatment.

There is also a problem that, in the case of forming a wiring layer in the ceramic substrate, the wiring layer gets deformed by the heat treatment so that the ceramic substrate cannot be produced as designed.

On the other hand, for the production of the measurement jig, the wafer-test connection terminal is formed on one main surface of the ceramic substrate manufactured through the above process steps. With the repeated use of the measurement jig, the connection terminal is repeatedly brought into contact with the wafers to be tested. It is thus required that the connection terminal has high adhesion strength and high connection reliability to the ceramic substrate.

However, the brittle layer is present at the surface portion of the ceramic substrate immediately after the polishing treatment as mentioned above so that the connection terminal is joined to the ceramic substrate through the brittle layer. This brittle layer can be broken by e.g. a long-term stress load because of its brittleness. Not only the substantial joint strength of the connection terminal to the ceramic substrate but also the connection reliability between the connection terminal and the ceramic substrate are deteriorated in the occurrence of breakage of the brittle layer during the repeated use of the measurement jig.

There is further a problem that the connection terminal gets deformed by the heat treatment for modification and repair of the brittle layer.

By forming the connection terminal after the modification and repair of the brittle layer, it is possible to avoid the above problem but is not yet possible to attain sufficient joint strength between the ceramic substrate and the connection terminal.

Further, Patent Document 2 describes an attempt to perform lapping treatment on the ceramic substrate with free abrasive grains after the polishing treatment and thereby remove the brittle layer from the ceramic substrate. In this technique, it is possible to improve the strength of the ceramic substrate but is not possible to improve the joint strength between the ceramic substrate and the connection terminal.

There is also a problem in the technique of Patent Document 2 that, in the case of forming a wiring layer and a via conductor layer in the ceramic substrate, the wiring and via conductor layers protrude from the ceramic substrate due to a difference in polishing amount between the ceramic substrate and the wiring and via conductor layers. This can lead to improper formation of the connection terminal.

Furthermore, Patent Documents 3 and 4 disclose a technique for fixing the connection terminal (input/output pin) to the ceramic substrate by brazing. As the adhesion strength between the ceramic substrate and a conductor layer to which the input/output pin is connected is not sufficient, the layer structure of the conductor layer is studied in Patent Document 3 so as to relieve stress on the conductor layer. In Patent Document 4, the brazing of the connection terminal to a cover-coated conductor layer is studied in consideration of the adhesion strength between the ceramic substrate and the conductor layer.

Patent Document 1: Japanese Laid-Open Patent Publication No. 5-235551
Patent Document 2: Japanese Laid-Open Patent Publication No. 5-075264
Patent Document 3: Japanese Laid-Open Patent Publication No. 8-115999
Patent Document 4: Japanese Laid-Open Patent Publication No. 8-236938

DISCLOSURE OF THE INVENTION

Problems to be Solved by the Invention

It is an object of the present invention to provide a novel ceramic substrate capable of attaining good adhesion, i.e., high joint strength to a connection terminal while securing sufficient strength.

Means for Solving the Problems

In order to achieve the above object, there is provided according to the present invention a ceramic substrate, comprising: a base material composed of an amorphous phase; and particles composed of a crystalline phase and dispersed in the base material, wherein some of the particles protrude from at least one surface of the base material.

There is also provided according to the present invention a manufacturing method of a ceramic substrate, comprising:

producing a sintered ceramic body, the sintered ceramic body comprising a base material composed of an amorphous phase and particles composed of a crystalline phase and dispersed in the base material; and performing a chemical mechanical polishing treatment on at least one surface of the sintered ceramic body.

The present inventors have made extensive researches to achieve the above object and, as a result, have found that a crystalline phase component protruding from the surface of the ceramic substrate plays a very important role in the adhesion i.e. joint strength between the surface of the ceramic substrate and the connection terminal.

Accordingly, the ceramic substrate of the present invention is so configured that the crystalline phase component (particles) is not only exposed at the surface of the ceramic substrate but also protrudes from the surface of the ceramic substrate. In this configuration, the connection terminal is formed on the ceramic substrate through the protruding crystalline phase component (particles) whereby the crystalline phase component produces an anchoring effect on the connection terminal. It is therefore possible to improve the joint strength of the connection terminal to the ceramic substrate.

In addition, a brittle layer containing microcracks is removed from the surface portion of the ceramic substrate when the crystalline phase component (particles) protrudes from the surface of the ceramic substrate as mentioned above. It is thus also possible to improve the strength of the ceramic substrate itself.

The configuration of the present invention, in which the crystalline phase component (particles) protrudes from the surface of the ceramic substrate with removal of the brittle layer from the surface portion of the ceramic substrate, can be attained by performing a chemical mechanical polishing (CMP) treatment on the surface of the ceramic substrate according to the above-mentioned manufacturing method.

The chemical mechanical polishing treatment is a general-purpose polishing technique and is commonly performed to improve the surface smoothness of an object to be polished. Conventionally, a semiconductor material or a metal material is used as the object to be polished by the chemical mechanical polishing treatment. In contrast to such conventional technology, the present invention is characterized by using the ceramic material as the object to be polished by the chemical mechanical polishing treatment and performing the chemical mechanical polishing treatment on the ceramic material for the purpose of roughening the surface of the ceramic material. Even though the general-purpose chemical mechanical polishing treatment is adopted in the present invention, the technical idea and effect of the adoption of the chemical mechanical polishing treatment according to the present invention are completely different from those according to the conventional technology.

When the ceramic substrate contains a crystalline filler and glass in the present invention, the crystalline filler and the glass constitute the crystalline phase and the amorphous phase, respectively.

According to one aspect of the present invention, the ratio of the particles protruding from the base material to the area of the at least one surface of the base material preferably ranges from 0.30 to 0.45.

If the ratio exceeds 0.45, the proportion of the glass in the ceramic substrate becomes decreased so that the ceramic substrate may not be sufficiently prevented from shrinkage during the sintering process and thus may not be improved in dimension accuracy adequately. By contrast, if the ratio is smaller than 0.30, the adhesion strength between the ceramic substrate and the connection terminal may decrease with the proportion of the filler exposed at the surface of the ceramic substrate.

It is thus possible to secure balance between the dimension accuracy of the ceramic substrate and the adhesion strength of the connection terminal to the ceramic substrate by setting the ratio of the particles protruding from the base material to the area of the at least one surface of the ceramic substrate to within the range of 0.30 to 0.45 according to the one aspect of the present invention.

According to another aspect of the present invention, surfaces of the some of the particles protruding from the at least one surface of the base material are preferably flattened. This allows, in the case of manufacturing a functional ceramic substrate unit as mentioned below, an increase in the contact area of the ceramic substrate with a conductive element so as to enhance the anchoring effect on the conductive element. It is thus possible to improve the adhesion between the ceramic substrate and the conductive element.

In the present invention, a mechanical polishing treatment may be performed, after producing the sintered ceramic body and before performing the chemical mechanical polishing treatment, on the surface of the sintered ceramic body subjected to the chemical mechanical polishing treatment. This mechanical polishing treatment is generally performed to control the thickness of the ceramic substrate.

A brittle layer containing microcracks is formed at the surface portion of the sintered ceramic body by the mechanical polishing treatment, but can be removed by the subsequent chemical mechanical polishing.

According to still another aspect of the present invention, there is provided a functional ceramic substrate unit by forming a conductive element on the above-produced ceramic substrate through the protruding crystalline phase component (particles). This functional ceramic substrate unit, which has the conductive element on the surface of the ceramic substrate, can be used as e.g. a wafer test substrate unit by selecting the kind of the conductive element as appropriate.

EFFECTS OF THE INVENTION

As described above, it is possible in the present invention to provide a noble ceramic substrate capable of attaining good adhesion i.e. high joint strength to a connection terminal while securing sufficient strength.

BEST MODES FOR CARRYING OUT THE INVENTION

Embodiments of the present invention will be described below with reference to the drawings.

[Ceramic Substrate]

Figure 2:
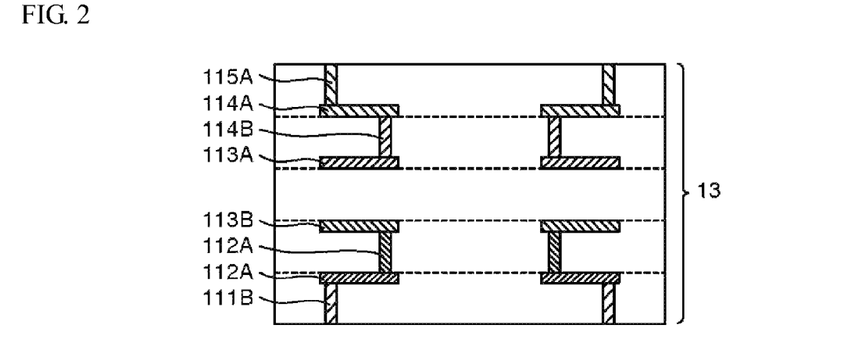
FIG. 2 is a diagram showing a process of the manufacturing method of the ceramic substrate according to the one embodiment of the present invention.
Figure 3:
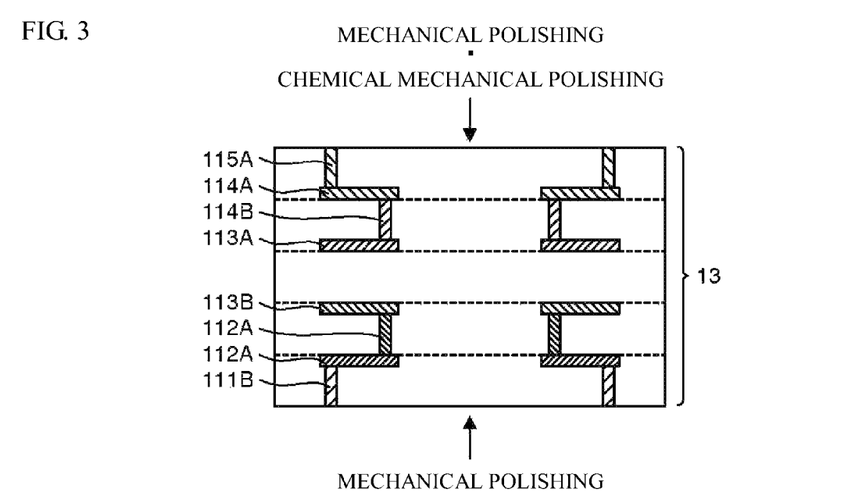
FIG. 3 is a diagram showing a process of the manufacturing method of the ceramic substrate according to the one embodiment of the present invention.
Figure 4:
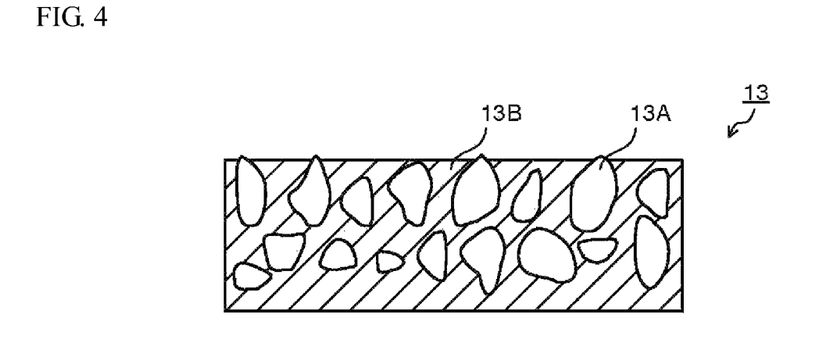
FIG. 4 is a diagram showing a process of the manufacturing method of the ceramic substrate according to the one embodiment of the present invention.
Figure 5:
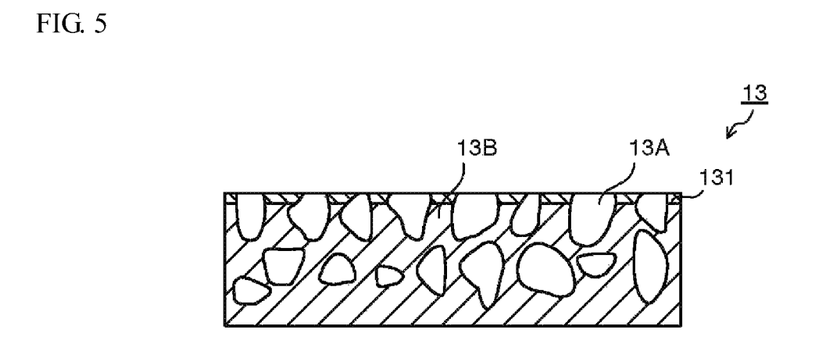
FIG. 5 is a diagram showing a process of the manufacturing method of the ceramic substrate according to the one embodiment of the present invention.
Figure 6:
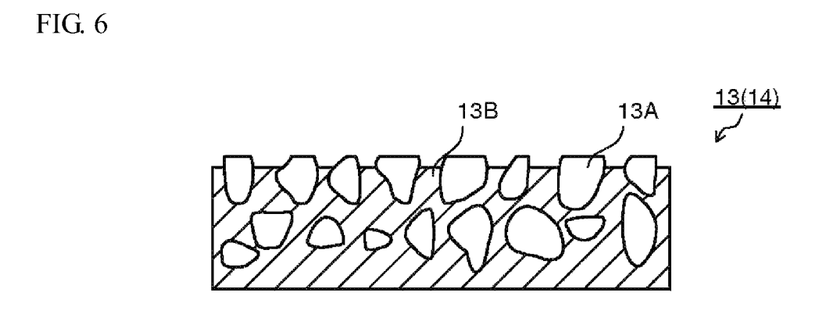
FIG. 6 is a diagram showing a process of the manufacturing method of the ceramic substrate according to the one embodiment of the present invention.

FIGS. 1 to 6 show processes of a manufacturing method of a ceramic substrate according to one embodiment of the present invention. More specifically, FIGS. 4 to 6 are enlarged views showing surface conditions of a sintered ceramic body in polishing treatment processes of the manufacturing method. It is herein noted that the manufacturing method described below is merely one example and is not intended to limit the present invention thereto.

Figure 1:
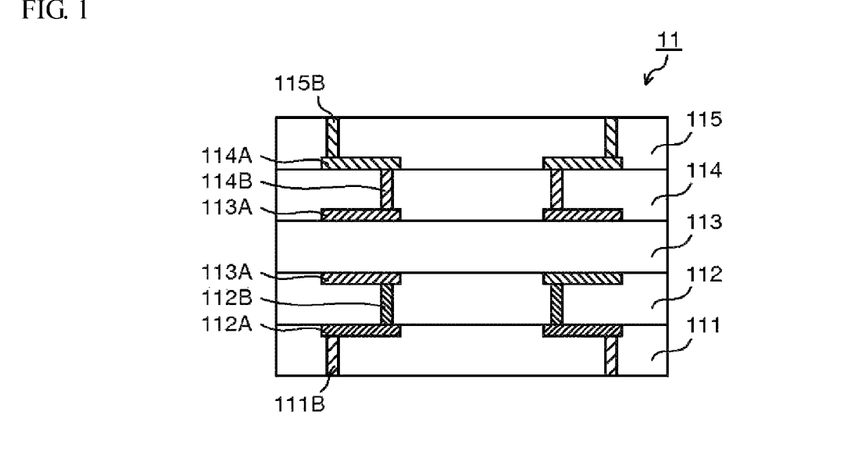
FIG. 1 is a diagram showing a process of a manufacturing method of a ceramic substrate according to one embodiment of the present invention.

Total five green sheets 111 to 115 are first prepared and laminated together successively to provide a multilayer green-sheet laminate 11 as shown in FIG. 1. At this time, inner conductor layers 112A are formed on a front surface of the green sheet 112. Inner conductor layers 113A are similarly formed on front and back surfaces of the green sheet 113. Inner conductor layers 114A are also similarly formed on a front surface of the green sheet 114.

Further, via conductor layers 112B are formed in the green sheet 112 so as to establish an electrical connection between the inner conductor layers 112A and 113A. Via conductor layers 114B are formed in the green sheet 114 so as to establish an electrical connection between the inner conductor layers 113A and 114A. Via conductor layers 111B and 115B are formed in the green sheets 111 and 115 so as to electrically connect the inner conductor layers 112A and 114A to an outer conductor layer and a connection terminal on the later-obtained ceramic substrate, respectively.

Although the number of the green sheets is set to five in the present embodiment, an arbitrary number of green sheets can be used as needed. For example, a single green sheet may be used. The form and number of the inner conductor layers and the form and number of the via conductor layers can also be set arbitrarily as needed. The green sheets to which the inner conductor layers and the via conductor layers are applied can be selected and set as appropriate.

Each of the green sheets 111 to 115 contains a crystalline filler and glass.

Examples of the crystalline filler quartz, alumina, zirconium oxide, mullite, forsterite, enstatite, spinel, magnesia, calcium zirconate, strontium silicate, calcium titanate, barium titanate and the like. It is preferable to use alumina due to the fact that the alumina shows particularly high crystallinity, does not shrink by sintering and thereby does not cause deterioration in dimension accuracy, and provides high joint strength to the connection terminal formed on the surface of the finally obtained ceramic substrate.

Examples of the glass are those containing at least $SiO_2$ and further containing at least one oxide component selected from the group consisting of $Al_2O_3$, $B_2O_3$, ZnO, PbO, alkali-earth metal oxides and alkali metal oxides, such as: borosilicate glasses e.g. $SiO_2$—$B_2O_3$ glass, $SiO_2$—$B_2O_3$—$Al_2O_3$ glass and $SiO_2$—$B_2O_3$—$Al_2O_3$—MO glass (where M is Ca, Sr, Ba or Zn); alkali silicate glasses; Ba glasses; Pb glasses; Bi glasses; and the like.

Herein, the green sheets 111 to 115 can be prepared by mixing the crystalline filler and the glass with a given binder material and optionally with a solvent, a plasticizer and the like and applying the resulting ceramic slurry by a doctor blade process, a rolling process, a pressing process or the like.

The via conductor layer 112B and the other via conductor layers can be formed by drilling holes in the above-prepared green sheets and filling conductors in the holes, respectively. The inner conductor layer 112A and the other inner conductor layers can be formed by performing a screen printing process, a plating process or the like on the above-prepared green sheets.

Preferably, the inner conductor layer 112A and the other inner conductor layers as well as the via conductor layer 112B and the other via conductor layers contain at least one selected from the group consisting of Ag, Au, Ag/Pt alloy, Ag/Pd alloy and Cu. These metal materials are electrically highly conductive and chemically stable and thus can exist stably without causing a loss of the functions of the conductor layers even when subjected to the below-mentioned sintering process.

The multilayer green-sheet laminate 11 is next sintered in the state shown in FIG. 1. In the present embodiment, air is used as the sintering atmosphere. There is however no problem in alternatively using an inert gas or nitrogen gas as the sintering atmosphere. The sintering temperature can be set to 800 to 1000° C. The sintering time can be set to 10 to 120 minutes. As shown in FIG. 2, a sintered ceramic body 13 is obtained by sintering the multilayer green-sheet laminate 11. This sintering process may be performed by a constrained sintering technique as appropriate.

Subsequently, a mechanical polishing treatment is performed on front and back surfaces of the sintered ceramic body 13 in such a manner that the thickness of the sintered ceramic body 13 becomes substantially equal to a desired thickness of the ceramic substrate (rough control) as shown in FIG. 3. The mechanical polishing treatment process can be performed by a general-purpose technique such as polishing with a lap, polishing with a polish or the like.

After that, a chemical mechanical polishing treatment is performed on the front surface of the sintered ceramic body 13 on which the conductive element such as connection terminal is to be formed. The chemical mechanical polishing treatment process can be performed under general-purpose conditions with the use of a chemical (acid or alkali) and abrasives.

Before performing the mechanical polishing treatment, the sintered ceramic body 13 is in a state that the crystalline phase i.e. particles 13A of the crystalline filler is being dispersed in the amorphous phase i.e. base material 13B of the glass as shown in FIG. 4.

When the mechanical polishing treatment is performed, a brittle layer 131 containing microcracks is formed at a surface portion of the sintered ceramic body 13 as shown in FIG. 5. When the chemical mechanical polishing treatment is performed subsequently, the brittle layer 131 is removed so that some of the particles 13A protrude from the surface of the base material 13B as shown in FIG. 6 due to the fact that the etching rate of the base material 13B is greater than the etching rate of the particles 13A.

In the present embodiment, the protrusion length of the particles 13A is 10 nm or greater. The upper limit of the protrusion length is approximately 500 nm in the present embodiment although it depends on the kind of the glass constituting the base material 13B and the kind of the crystalline filler constituting the particles 13A.

The sintered ceramic body 13 after subjected to the chemical mechanical polishing treatment is used as a ceramic substrate 14. When the conductor layer such as connection terminal is formed on the polished surface of the ceramic substrate 14, it is possible to attain high joint strength of the conductor layer by the anchoring effect of the particles 13A protruding from the surface of the ceramic substrate 14.

As shown in FIG. 6, there occurs such a specific phenomenon that some of the particles 13A protrude from the surface of the base material 13B by the application of the chemical mechanical polishing treatment to the ceramic material in the present embodiment. On the other hand, surfaces of these the particles 13A themselves are flattened by the chemical mechanical polishing treatment similarly to the effects of conventional chemical mechanical polishing treatments. It is possible by flattening the surfaces of the particles 13A to increase the contact area between the ceramic substrate and the conductive element, enhance the anchoring effect of the particles on the conductive element and thereby improve the adhesion between the ceramic substrate and the conductive element.

It is further possible to finely control the thickness of the sintered ceramic body 13 by the chemical mechanical polishing treatment in such a manner that the thickness of the sintered ceramic body becomes equal to the desired thickness of the ceramic substrate 14.

Although the mechanical polishing treatment is performed on the sintered ceramic body 13 as mentioned above in the present embodiment, the mechanical polishing treatment may be omitted. In such a case, the rough control of the thickness of the sintered ceramic body 13 is also carried out by the chemical mechanical polishing treatment. However, the polishing rate of the chemical mechanical polishing treatment is relatively low. It may thus take a long time to perform the chemical mechanical polishing treatment when there is a large difference between the thickness of the sintered ceramic body 13 and the desired thickness of the ceramic substrate 14.

Furthermore, the chemical mechanical polishing treatment may be also performed on the back surface of the sintered ceramic body 13 although the chemical mechanical polishing treatment is performed on only the front surface of the sintered ceramic body 13 in the present embodiment.

It is preferable that the ratio of an occupying area Sr of the particles 13A on the surface of the sintered ceramic body 13 after the polishing treatment, i.e., on the surface of the ceramic substrate 14 to the whole area of the surface of the ceramic substrate 14 is in a range of 0.30 to 0.45. The occupying area can be controlled by e.g., in the preparation of the ceramic green sheets, mixing the raw glass power material and the raw crystalline particle material at such a ratio as to satisfy the following relationship: [volume of raw crystalline particle material/(volume of raw crystalline particle material+volume of raw glass powder material)]=0.3 to 0.45.

If the ratio exceeds 0.45, the proportion of the glass in the ceramic substrate 14 becomes decreased so that the ceramic substrate 14 may not be sufficiently closely packed and may not be prevented from shrinkage. This results in not only failure to improve the dimension accuracy of the ceramic substrate 14 adequately but also deterioration in the mechanical properties of the ceramic substrate. By contrast, if the ratio is smaller than 0.30, the adhesion strength between the ceramic substrate 14 and the connection terminal may decrease with the proportion of the particles 13A exposed at the surface i.e. the proportion of the crystalline filler.

It is possible to secure balance between the dimension accuracy of the ceramic substrate 14 and the adhesion strength of the connection terminal to the ceramic substrate 14 by setting the ratio of the occupying area Sr of the particles 13A on the surface of the ceramic substrate 14 to the whole area of the surface of the ceramic substrate 14 to within the range of 0.30 to 0.45 as mentioned above.

Herein, the occupying area Sr can be determined by observing the surface of the ceramic substrate with an electron microscope (at a magnification of 2000 times) after the chemical mechanical polishing treatment. In the observation, the obtained image may be processed by binarization as needed.

(Functional Ceramic Substrate Unit)

Figure 7:
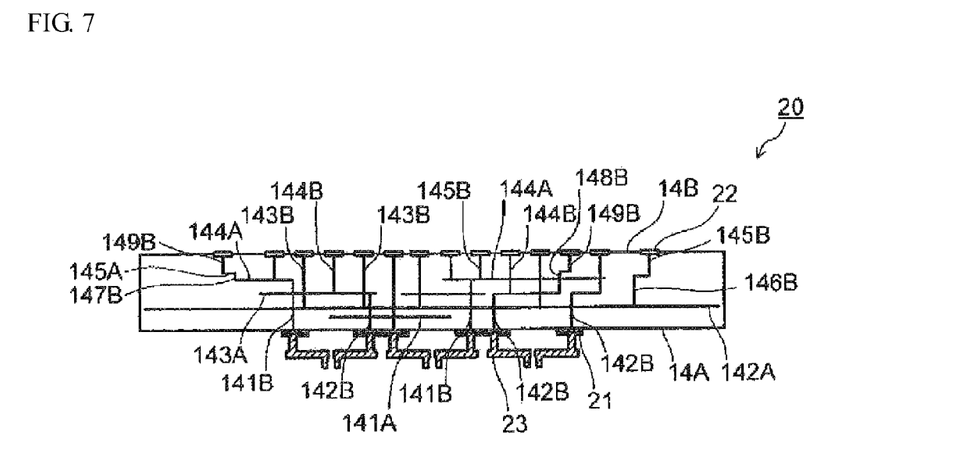
FIG. 7 is a section view of a functional ceramic substrate unit according to another embodiment of the present invention.

Next, a functional ceramic substrate unit using the above-obtained ceramic substrate will be described below. FIG. 7 is a cross section view of a functional ceramic substrate unit according to one embodiment of the present invention. In FIG. 7, the same or like elements are designated by the same reference numerals as those of the ceramic substrate shown in FIGS. 1 to 6.

As shown in FIG. 7, the functional ceramic substrate unit 20 includes the above-obtained ceramic substrate 14. First outer conductors 21 are provided on a first main surface (lower surface) 14A of the ceramic substrate 14, whereas second outer conductors 22 are formed on a second main surface (upper surface) 14B of the ceramic substrate 14. Further, microprobes 23 for electrical testing are provided on the first outer conductors 21 so as to astride adjacent ones of the first outer conductors 21.

Each of the first and second outer conductors 21 and 22 preferably has a layer structure in which Ti, Cu, Ni and Au layers are successively laminated together. This layer structure can be formed by sputtering a Ti film and applying Cu plating, Ni plating and Au plating to the Ti film sequentially.

The ceramic substrate 14 is so structured that some of the particles protrude from the surface of the base material (with the surfaces of the some of the particles being flattened) as shown in e.g. FIG. 6 as the chemical mechanical polishing treatment as well as the mechanical polishing treatment have been performed on the first main surface 14A of the ceramic substrate 14 on which the first outer conductors 21. By the anchoring effect of these particles, the joint strength between the ceramic substrate 14 and the outer conductors 21, and by extension, the joint strength between the ceramic substrate 14 and the microprobes through the outer conductors 21 can be increased.

This makes it thus possible that, even when the microprobes 23 are repeatedly brought into contact with IC elements on semiconductor substrates and, more specifically, silicon (Si) wafers for repeated electrical test of the IC elements on these plurality of silicon wafers, the electrical test can be conducted stably for a long time without causing poor connection of the microprobes 23, or equivalently, the first outer conductors 21 to the ceramic substrate 14 by contact pressures etc.

The second main surface 14B of the ceramic substrate 14 on which the second outer conductors 22 are provided is not used for the above electrical test by attaching thereto probe pins as mentioned above. For this reason, the joint strength between the ceramic substrate 14 and the second outer conductors 22 is not necessarily so high. It is thus enough to perform only the mechanical polishing treatment on the second main surface of the ceramic substrate 14 without performing the chemical mechanical polishing treatment. This does not however mean to eliminate the possibility to perform the chemical mechanical polishing treatment on the second main surface of the ceramic substrate 14.

A plurality of inner conductors 141A to 145A are provided in layer form in the ceramic substrate 14. Interlayer connection conductors 141B to 149B are also provided in the ceramic substrate so as to establish electrical connections between any ones of the inner conductors 141A to 145A and between any of the inner conductors 141A to 145A and the first and second outer conductors 21 and 22. More specifically, the first outer conductors 21 are electrically connected with the inner conductors 144A by the interlayer connection conductors 141B and electrically connected with the inner conductors 143A by the interlayer connection conductors 142B; and the second outer conductors 22 are electrically connected with the inner conductors 142A by the interlayer connection conductors 143B.

The second outer conductors 22 are electrically connected with the inner conductors 143A by the interlayer connection conductors 144B and electrically connected with the inner conductors 144A by the interlayer connection conductors 145B. The inner connectors 142A and 144A are electrically connected with each other by the interlayer connection conductors 146B.

The inner conductors 144A and 145A are electrically connected with each other by the interlayer connection conductor 147B; the inner conductors 143A and 145A are electrically connected with each other by the interlayer connection conductor 148B; and the inner conductor 145A and the outer conductor 21 are electrically connected with each other by the interlayer connection conductor 149B.

As a result, the first outer conductors 21 and the probe pins 23 are electrically connected to the second outer conductors 22.

The functional ceramic substrate unit 20 of FIG. 7 can be provided with dimensions of 5 mm thickness×300 mm length×300 mm width. In this case, it is possible to conduct electrical test simultaneously on a plurality of IC elements on a φ300 mm (12 inch) diameter silicon wafer before separating the IC elements by cutting the wafer, i.e., possible to conduct electrical test on a plurality of IC test by a single electrical test operation.

(Probe Card)

Figure 8:
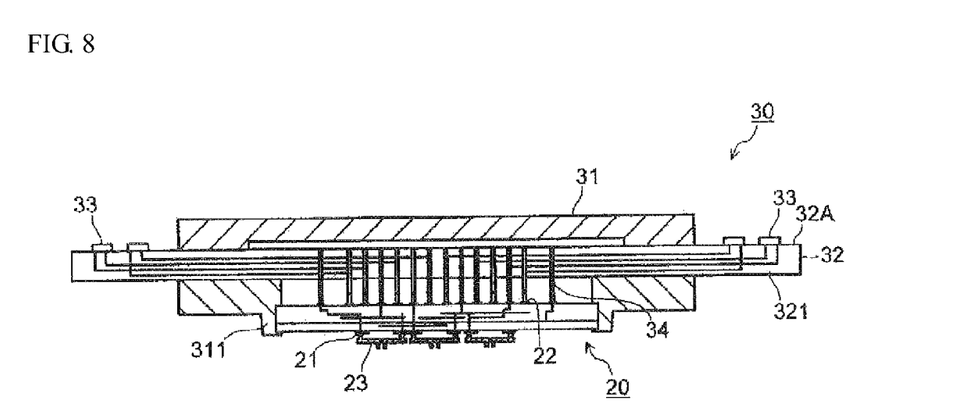
FIG. 8 is a section view of a probe card according to still another embodiment of the present invention.

Next, a probe card using the above-obtained functional ceramic substrate unit will be described below. FIG. 8 is a cross section view of a probe card according to another embodiment of the present invention. In FIG. 8, the same or like elements are designated by the same reference numerals as those of the ceramic substrate shown in FIGS. 1 to 6 and of the functional ceramic substrate unit shown in FIG. 7.

As shown in FIG. 8, the probe card 30 includes a metal frame 31. A flange 311 is formed on a lower portion of the metal frame 31 so that the functional ceramic substrate unit 20 of FIG. 7 is fixed to the metal frame 31 by the flange 311. Herein, the inner conductors and interlayer connection conductors in the functional ceramic substrate unit 20 are omitted from the drawing for the purpose of simplification.

A printed wiring board 32 is provided laterally through the metal frame 31. Connection terminals 33 are arranged on upper surfaces 32A of end portions of the printed wiring board 32 exposed from the metal frame 31. These connection terminals 33 are connected to a current supply source (power source) for the probe card 30 to conduct electrical test on IC elements on a silicon wafer and connected to an external device for measuring test signals (current values) in the electrical test although not so shown in the drawing.

Further, an inner conductor 321 is provided in the printed wiring board 32 so as to extend substantially in parallel with both of main surfaces of the printed wiring board 32. Connection terminals 34 are arranged on the second outer conductors 22 of the functional ceramic substrate unit 20 and each have electrical connections to the inner conductor 321 provided in the printed wiring board 32. The functional ceramic substrate 20 and the printed wiring board 32 are thus electrically connected to each other so that, in the case of conducting the electrical test of the IC elements on the silicon wafer by the probe card 30, or equivalently, by the functional ceramic substrate unit 20, the results of the electrical test of the IC elements are detected by the external device through the connection terminals 33 as mentioned above.

EXAMPLES

Preparation of Green Sheets

A ceramic slurry was obtained by filling 1 kg in total of a borosilicate glass predominantly composed of $SiO_2$, $Al_2O_3$ and $B_2O_3$ and an alumina powder into an alumina pot at a weight ratio of 50:50, adding 120 g of an acrylic resin binder, a solvent (MEK) and a plasticizer (DOP) into the pot, and then, mixing the resulting mixture for 5 hours. This ceramic slurry was applied by a doctor blade process, thereby forming green sheets with a thickness of 0.15 mm. Herein, the alumina powder had an average particle size of 2 μm and a specific surface of 1 $m^2/g$.

(Manufacturing of Ceramic Substrates)

Via conductor layers were formed by drilling holes in the above-prepared green sheets and filling conductors in the holes, respectively. Further, inner conductor layers were formed on the above-prepared green sheets, respectively. A green-sheet laminate was obtained from these green sheets as shown in FIG. 1. The obtained green-sheet laminate was sintered at 850° C. for 30 minutes to produce a sintered ceramic body as shown in FIG. 2.

Subsequently, one surface of the sintered ceramic body was subjected to a mechanical polishing treatment by a lap polishing machine using #400 alumina abrasives as needed, and then, subjected to a chemical mechanical polishing treatment. The chemical mechanical polishing treatment was herein performed with the use of colloidal silica abrasives in an alkaline solution (pH 11).

Figure 9:
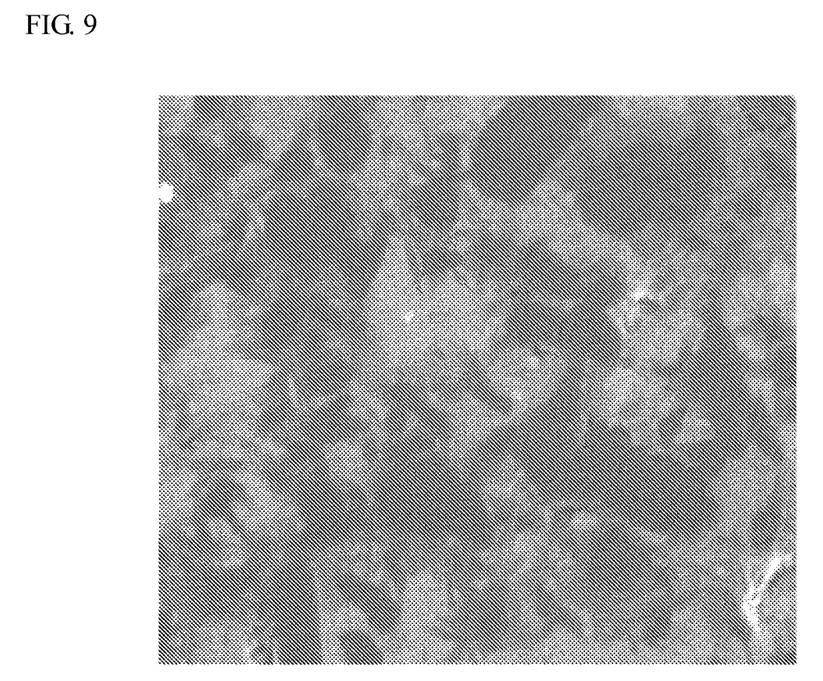
FIG. 9 is a diagram showing a surface condition of a sintered ceramic body (subjected to only mechanical polishing) before chemical mechanical polishing.
Figure 10:
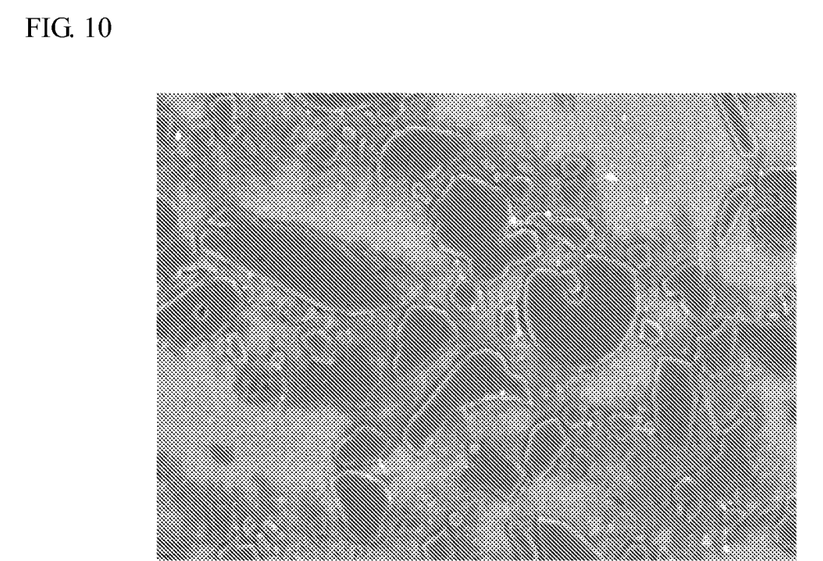
FIG. 10 is a diagram showing a surface condition of the sintered ceramic body after chemical mechanical polishing.

FIGS. 9 and 10 shows surface conditions of the sintered ceramic body before and after the chemical mechanical polishing treatment. More specifically, FIG. 9 shows the surface condition of the sintered ceramic body before subjected to the chemical mechanical polishing treatment (after subjected to only the mechanical polishing treatment); and FIG. 10 shows the surface condition of the sintered ceramic body after subjected to the chemical mechanical polishing). In these microphotographs, the black areas correspond to crystalline solid, i.e., alumina particles; and the light areas correspond to amorphous solid, i.e., glass.

As is apparent from comparison of the surface conditions of FIGS. 9 and 10, the surfaces of the alumina particles were flattened in FIG. 10. It is thus clear that the surfaces of the alumina particles protruding from the glass base material were flattened by the chemical mechanical polishing treatment.

(Evaluation of Ceramic Substrates)

Samples were manufactured by producing ceramic substrates in the same manner as above, and forming conductor layers by sputtering, plating, exposure and development on the respective surfaces of the ceramic substrates that had been polished with the alumina abrasives. Each of the samples was tested for the joint strength of the conductor layer to the ceramic substrate. More specifically, a thin film was applied by sputtering and plating and subjected to exposure and development to provide a pad of □ 100 μm×t40 μm. The shear strength of the pad was measured with a shear tester (DAGE4000) from the side of the pad at a height of 10 μm. The joint strength was determined from the obtained shear strength and the adhesion area (10000 μm²) of the pad. The results are indicated in TABLE 1.

TABLE 1

| | Polishing condition | Treatment | Adhesion strength (mg/μm²) |
|---|---|---|---|
| Example 1 | polish | CMP by acid solution | 16.6 |
| Example 2 | polish | CPM by alkali solution | 17.8 |
| Example 3 | polish | CMP by acid solution | 15.0 |
| Example 4 | polish | CPM by alkali solution | 17.1 |
| Example 5 | — | CPM by alkali solution | 15.4 |
| Comparative Example 1 | lap | none | 9.6 |
| Comparative Example 2 | lap | air baking at 850° C. | 14.6 |
| Comparative Example 3 | polish | none | 9.8 |
| Comparative Example 4 | polish | air baking at 850° C. | 11.7 |
| Comparative Example 5 | polish | none | 10.1 |

As is apparent from TABLE 1, in the case of obtaining the ceramic substrate by performing the chemical mechanical polishing treatment on the sintered ceramic body according to the present invention (Examples 1-5), the joint strength of the ceramic substrate and the conductor layer was at a high level of 15 mg/mm² or higher regardless of whether or not performing the mechanical polishing treatment.

In the case of obtaining the ceramic substrate without performing the chemical mechanical polishing treatment on the sintered ceramic body (Comparative Examples 1-5), by contrast, the joint strength of the ceramic substrate and the conductor layer was low, and particularly low when performing only the mechanical polishing treatment with no air baking, as is apparent from TABLE 1.

It is thus shown by the above examples that it was possible, by performing the chemical mechanical polishing treatment on the sintered ceramic body according to the present invention, to allow the crystalline phase particles of the filler protrude from the surface of the obtained ceramic substrate and improve the joint strength between the ceramic substrate and the conductor layer by the anchoring effects of these particles.

Although the present invention has been described above with reference to the specific embodiments, the present invention is not limited to the above embodiments. Various modification and variation of the embodiments described above will occur to those skilled in the art without departing from the scope of the present invention.

The invention claimed is:

1. A ceramic substrate for use in a wafer test substrate unit, comprising:
    a base material composed of an amorphous phase; and
    particles composed of a crystalline phase dispersed in the base material,
    wherein some of the particles protrudes from at least one surface of the base material and have flattened surfaces.

2. The ceramic substrate for use in the wafer test substrate unit according to claim 1, wherein the amorphous phase contains glass; and the crystalline phase contains a crystalline filler.

3. The ceramic substrate for use in the wafer test substrate unit according to claim 1, wherein a ratio of an occupying area of the particles protruding from the at least one surface of the base material to a whole area of the surface of the base material is in a range of 0.3 to 0.45.

4. A manufacturing method of the ceramic substrate for use in the wafer test substrate unit according to claim 1, comprising:
    producing a sintered ceramic body, the sintered ceramic body having a base material composed of an amorphous phase and particles composed of a crystalline phase and dispersed in the base material;
    performing a chemical mechanical polishing treatment on at least one surface of the sintered ceramic body; and
    after producing the sintered ceramic body and before performing the chemical mechanical polishing treatment, performing a mechanical polishing treatment on the at least one surface of the sintered ceramic body.

5. A functional ceramic substrate unit, comprising:
    a ceramic substrate having a base material composed of an amorphous phase and particles composed of a crystalline phase and dispersed in the base material, some of the particles protruding from at least one surface of the base material;
    a conductive element formed on the at least one surface of the base material of the ceramic substrate via the particles; and
    a metal element attached to the conductive element.

6. The functional ceramic substrate unit according to claim 5, wherein the amorphous phase contains glass; and the crystalline phase contains a crystalline filler.

7. The functional ceramic substrate unit according to claim 5, wherein a ratio of an occupying area of the particles protruding from the at least one surface of the base material to a whole area of the surface of the base material is in a range of 0.3 to 0.45.

8. The functional ceramic substrate unit according to claim 5, wherein the some of the particles protruding from the at least one surface of the base material have flattened surfaces.

9. A probe card, comprising: the functional ceramic substrate unit according to claim 5, wherein the metal element is a probe pin.

10. A manufacturing method of the functional ceramic substrate unit according to claim 5, comprising:
    producing a sintered ceramic body, the sintered ceramic body having a base material composed of an amorphous phase and particles composed of a crystalline phase and dispersed in the base material;
    performing a chemical mechanical polishing treatment on at least one surface of the sintered ceramic body;
    after producing the sintered ceramic body and before performing the chemical mechanical polishing treatment, performing a mechanical polishing treatment on the at least one surface of the sintered ceramic body; and
    after performing the chemical mechanical polishing treatment, forming a conductive element on the at least one surface of the base material of the sintered ceramic body.

11. The manufacturing method of the functional ceramic substrate unit according to claim 5 wherein the conductive element has a layer structure in which a Ti layer, a Cu layer, a Ni layer and a Au layer are successively laminated together.

* * * * *